(12) United States Patent
Seo (10) Patent No.: US 12,381,077 B2
(45) Date of Patent: Aug. 5, 2025

(54) METHODS OF FILLING RECESSES ON SUBSTRATE SURFACES AND FORMING VOIDS THEREIN

(71) Applicant: ASM IP Holding B.V., Almere (NL)

(72) Inventor: Jungtak Seo, Seongdong-Gu (KR)

(73) Assignee: ASM IP Holding B.V., Almere (NL)

( * ) Notice: Subject to any disclaimer, the term of this patent is extended or adjusted under 35 U.S.C. 154(b) by 450 days.

(21) Appl. No.: 17/990,867

(22) Filed: Nov. 21, 2022

(65) Prior Publication Data

US 2023/0170209 A1   Jun. 1, 2023

Related U.S. Application Data

(60) Provisional application No. 63/283,653, filed on Nov. 29, 2021.

(51) Int. Cl.
| | |
|---|---|
| *H01L 21/02* | (2006.01) |
| *C23C 16/32* | (2006.01) |
| *C23C 16/509* | (2006.01) |
| *H01J 37/32* | (2006.01) |

(52) U.S. Cl.
CPC ........ *H01L 21/0228* (2013.01); *C23C 16/325* (2013.01); *C23C 16/509* (2013.01); *H01J 37/32449* (2013.01); *H01L 21/02167* (2013.01); *H01L 21/02208* (2013.01); *H01L 21/02274* (2013.01); *H01J 2237/332* (2013.01)

(58) Field of Classification Search
None
See application file for complete search history.

(56) References Cited

U.S. PATENT DOCUMENTS

| | | |
|---|---|---|
| 6,949,456 B2 | 9/2005 | Kumar |
| 8,241,991 B2 | 8/2012 | Hsieh |
| 9,287,198 B2* | 3/2016 | Yang ............... H01L 21/7682 |
| 9,859,151 B1 | 1/2018 | Zhu |
| 10,541,173 B2 | 1/2020 | Zhu |
| 10,707,119 B1* | 7/2020 | LiCausi ........... H01L 21/76834 |
| 11,094,582 B2 | 8/2021 | Zhu |
| 2008/0124917 A1* | 5/2008 | Oh ................... H01L 21/76885 |
| | | 257/E21.597 |
| 2009/0115061 A1* | 5/2009 | Chen ............... H01L 21/76807 |
| | | 257/E23.141 |
| 2012/0074484 A1* | 3/2012 | Kang .................. H10B 41/40 |
| | | 257/E21.422 |

(Continued)

*Primary Examiner* — Asok K Sarkar
(74) *Attorney, Agent, or Firm* — Snell & Wilmer L.L.P.

(57) ABSTRACT

A method of filling a recess on a surface of a substrate may comprise performing a deposition cycle on the substrate; allowing the deposited material to flow into the recess; and creating a void within the recess in response to the allowing the deposited material to flow. A void size of the void can be based on a ratio of a deposition repeat number of times that the deposition step is repeated to a treatment repeat number of times that the treatment cycle is repeated. The deposition cycle can comprise: providing an inert gas to the reaction chamber; performing a deposition step; and performing a treatment step. A deposition step can comprise: providing a precursor to the reaction chamber; and/or forming a deposited material from the precursor. A treatment step can comprise forming a plasma in the reaction chamber by applying a plasma power and treating the deposited material.

20 Claims, 7 Drawing Sheets

(56) References Cited

U.S. PATENT DOCUMENTS

| | | | | |
|---|---|---|---|---|
| 2014/0106537 A1* | 4/2014 | Kim | ................ | H01L 21/76224 |
| | | | | 438/424 |
| 2014/0131883 A1* | 5/2014 | Huang | ............ | H01L 23/53238 |
| | | | | 438/643 |
| 2015/0162277 A1* | 6/2015 | Zhang | .............. | H01L 21/31144 |
| | | | | 438/618 |
| 2016/0133671 A1* | 5/2016 | Fantini | ............. | H01L 21/76837 |
| | | | | 257/4 |
| 2017/0229337 A1* | 8/2017 | Park | ...................... | C23C 16/045 |
| 2018/0097059 A1* | 4/2018 | Bi | ......................... | H10D 84/83 |
| 2019/0148210 A1* | 5/2019 | Shibata | ............... | B25J 15/0033 |
| | | | | 294/103.1 |
| 2019/0385892 A1* | 12/2019 | Singh | ............... | H01L 21/30604 |
| 2020/0212192 A1* | 7/2020 | Xie | .................. | H01L 21/76895 |
| 2021/0167020 A1* | 6/2021 | Greenlee | ............... | H01L 23/562 |
| 2021/0193505 A1* | 6/2021 | Huang | ............... | H01L 21/7682 |
| 2021/0296486 A1* | 9/2021 | Chen | ..................... | H10D 30/68 |
| 2021/0343580 A1 | 11/2021 | Zhu | | |
| 2022/0102190 A1 | 3/2022 | Kang | | |
| 2022/0310387 A1 | 9/2022 | Lim | | |
| 2023/0065123 A1* | 3/2023 | Peng | ................ | H01L 21/76834 |
| 2023/0087442 A1* | 3/2023 | Hautala | .............. | H01L 21/7682 |
| | | | | 438/405 |
| 2023/0116971 A1* | 4/2023 | Yang | ..................... | H10B 69/00 |
| | | | | 438/622 |
| 2023/0397423 A1* | 12/2023 | Zheng | ................. | H01L 21/764 |
| 2024/0032284 A1* | 1/2024 | Huang | ................. | H10B 12/30 |
| 2024/0063053 A1* | 2/2024 | Yong | ................ | H01L 21/02164 |
| 2024/0268104 A1* | 8/2024 | Liu | .................... | H01L 23/5222 |

\* cited by examiner

METHODS OF FILLING RECESSES ON SUBSTRATE SURFACES AND FORMING VOIDS THEREIN

CROSS-REFERENCE TO RELATED APPLICATIONS

This application claims priority to U.S. Provisional Patent Application Ser. No. 63/283,653 filed Nov. 29, 2021 titled METHODS OF FILLING RECESSES ON SUBSTRATE SURFACES AND FORMING VOIDS THEREIN, the disclosure of which is hereby incorporated by reference in its entirety.

FIELD OF DISCLOSURE

The present disclosure generally relates to methods of forming structures suitable for use in the manufacture of electronic devices. More particularly, examples of the disclosure relate to methods of forming structures that include a deposited material layer that can be used to fill recesses on a surface of the structure, to structures including such layers, and to systems for performing the methods and/or forming the structures.

BACKGROUND OF THE DISCLOSURE

During the manufacture of devices, such as semiconductor devices, it is often desirable to fill features or recesses (e.g., trenches or gaps) on the surface of a substrate with insulating or dielectric material. Some techniques to fill recesses include the deposition of a layer of flowable material, such as flowable carbon material or silicon carbide material.

As device and feature sizes continue to decrease, it becomes increasingly difficult to apply conventional flowable material deposition techniques to manufacturing processes, while obtaining desired fill capabilities and material properties. For example, as device, component, and recess sizes decrease, device characteristics may be suffering from increasing parasitic capacitance between device components. Accordingly, improved methods for forming structures, particularly for methods of filling recesses on a substrate surface with material, that mitigate shortcomings like parasitic capacitance are desired.

Any discussion, including discussion of problems and solutions set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

Various embodiments of the present disclosure relate to methods of forming structures suitable for use in the formation of electronic devices. While the ways in which various embodiments of the present disclosure address drawbacks of prior methods and structures are discussed in more detail below, in general, exemplary embodiments of the disclosure provide improved methods for forming structures that include deposited material suitable for filling recesses on a substrate surface and forming voids therein, structures including the deposited material, and systems for performing the methods and/or forming the structures.

In accordance with various embodiments of the disclosure, a method of filling a recess on a surface of a substrate is provided. In various embodiments, the method may comprise providing a substrate within a reaction chamber; performing a deposition cycle; allowing the deposited material to flow into the recess in the substrate; and creating a void within the recess in response to the allowing the deposited material to flow. A top portion of the void can be defined by the deposited material. A void size of the void can be based on a ratio of a deposition repeat number of times that the deposition step is repeated to a treatment repeat number of times that the treatment cycle is repeated. In various embodiments, the deposition cycle can comprise: providing an inert gas to the reaction chamber; performing a deposition step; and performing a treatment step. In various embodiments, a deposition step can comprise: providing a precursor to the reaction chamber; and/or forming a deposited material from the precursor. In various embodiments, a treatment step can comprise forming a plasma in the reaction chamber by applying a plasma power and treating the deposited material. In various embodiments, the deposited material can flow into the recess at a recess top portion and along a recess wall of the recess.

In various embodiments, the deposition cycle can further comprise purging the reaction chamber after the treating the deposited material. In various embodiments, the deposition cycle can further comprise performing a second treatment step on the deposited material after the treating the deposited material. In various embodiments, the deposition cycle can further comprise performing a second treatment step comprising forming the plasma by applying the plasma power and treating the deposited material after purging the reaction chamber. In various embodiments, treating the deposited material can comprise treating the deposited material with the plasma, and wherein performing the second treatment step on the deposited material can comprise treating the deposited material with at least one of oxygen gas or argon gas. In various embodiments, forming the plasma occurs during treating the deposited material and performing a second treatment step on the deposited material. In various embodiments, the inert gas is continuously flowed to the reaction chamber during the deposition step and the treatment step.

In various embodiments, in response to the ratio of the deposition repeat number to the treatment repeat number increasing, the void size can decrease, and wherein the void size can increase in response to the ratio of the deposition repeat number to the treatment repeat number decreasing.

In various embodiments, the inert gas can comprise at least one of argon, helium, or nitrogen. In various embodiments, the precursor can comprise a silicon carbide precursor. In various embodiments, the silicon carbide precursor can comprise a trisilylamine. In various embodiments, treating the deposited material can comprise treating the deposited material with at least one of the plasma, oxygen gas, or argon gas. Treating the deposited material can comprise treating the deposited material with the plasma. In various embodiments, during the deposition cycle, providing the precursor to the reaction chamber can occur during the step of forming the plasma in the reaction chamber, wherein the plasma formed during providing the precursor can be formed by applying a first plasma power, and wherein during the treating the deposited material, the plasma can be formed by applying a second plasma power, wherein the second plasma power can be greater than the first plasma power.

In various embodiments, during a deposition cycle, providing the precursor to the reaction chamber can occur during the step of forming the plasma within the reaction chamber. In various embodiments, during a deposition cycle, providing the precursor to the reaction chamber can begin after the step of forming the plasma begins. In various embodiments, during a deposition cycle, providing the precursor can cease before forming the plasma ceases.

In various embodiments, the ratio of the deposition repeat number to the treatment repeat number can be based on a width of the recess, wherein in response to the width being relatively larger, the ratio of the deposition repeat number to the treatment repeat number can be relatively lower, and wherein in response to the width being relatively smaller, the ratio of the deposition repeat number to the treatment repeat number can be relatively higher. In various embodiments, the ratio of the deposition repeat number to the treatment repeat number can be about 1:1 in response to the width of the recess being below 300 nanometers (nm). The ratio of the deposition repeat number to the treatment repeat number can be between 1:2 and 1:6 in response to the width of the recess being between 300 nm and 1000 nm.

In accordance with yet further exemplary embodiments of the disclosure, a system is provided for performing a method and/or for forming a structure as described herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures. Elements with like element numbering throughout the figures are intended to be the same.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The detailed description of various embodiments herein makes reference to the accompanying drawings, which show various embodiments by way of illustration. While these various embodiments are described in sufficient detail to enable those skilled in the art to practice the disclosure, it should be understood that other embodiments may be realized and that logical, chemical, and mechanical changes may be made without departing from the scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular component or step. Also, any reference to attached, fixed, coupled, connected, or the like may include permanent, removable, temporary, partial, full, and/or any other possible attachment option.

The present disclosure generally relates to methods of depositing materials, to methods of filling a recess on a surface of a substrate, to methods of forming structures, to structures formed using the methods, and to systems for performing the methods and/or forming the structures. By way of examples, the methods described herein can be used to fill features or recesses, such as gaps (e.g., trenches, vias, or spaces between protrusions) on a surface of a substrate with material, such as carbon, silicon oxide, silicon nitride, and/or silicon carbide material. The terms gap and recess can be used interchangeably. In various embodiments, voids may be formed within the recess, for example, within the material deposited on the substrate and within the recess.

To mitigate the risk or effects of parasitic capacitance between device components, materials with low dielectric constants may be used to fill recesses within substrates. Strategies include decreasing the relative dielectric constant between device components as close to a value of 1 as possible, which is close or similar to that of empty space (i.e., air or a void). Thus, the formation of voids within a deposited material in a substrate recess may mitigate the risk or effects of parasitic capacitance between device components. However, the presence of a void within a recess may cause mechanical stability issues within the substrate or device, for example, during thermal annealing or other backend process such as packaging (e.g., a void may cause a collapse therein, such as during thermal decomposition, or cracks can be initiated in a void in response to internal or external stresses). Thus, the methods and systems discussed herein allow the ability to control the size of a void within a substrate recess in order to receive the electrical benefits of a void, while achieving sufficient mechanical strength and stability.

Exemplary methods and structures described herein can be used in a variety of applications, including, but not limited to, cell isolation in 3D cross point memory devices, self-aligned vias, dummy gates, reverse tone patterns, PC RAM isolation, cut hard masks, DRAM storage node contact (SNC) isolation, and the like.

In this disclosure, "gas" can refer to material that is a gas at normal temperature and pressure, a vaporized solid and/or a vaporized liquid, and may be constituted by a single gas or a mixture of gases, depending on the context. A gas other than a process gas, i.e., a gas introduced without passing through a gas distribution assembly, such as a showerhead, other gas distribution device, or the like, may be used for, e.g., sealing a reaction space, which includes a seal gas, such as a rare gas. In some cases, such as in the context of deposition of material, the term "precursor" can refer to a compound that participates in the chemical reaction that produces another compound, and particularly to a compound that constitutes a film matrix or a main skeleton of a film, whereas the term "reactant" can refer to a compound, in some cases other than a precursor, that activates a precursor, modifies a precursor, or catalyzes a reaction of a precursor, for example, power (e.g., radio frequency (RF) power) is applied. In some cases, the terms precursor and reactant can be used interchangeably. The term "inert gas" refers to a gas that does not take part in a chemical reaction to an appreciable extent and/or a gas that excites a precursor (e.g., to facilitate polymerization of the precursor) when, for example, power (e.g., RF power) is applied, but unlike a reactant, it may not become a part of a film matrix to an appreciable extent.

As used herein, the term "substrate" can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as Group III-V or Group II-VI semiconductors, and can include one or more layers overlying or underlying the bulk material. Further, the substrate can include various features, such as recesses (e.g., gaps, vias, or spaces between protrusions), lines, and the like formed on or within at least a portion of a layer or bulk material of the substrate. By way of examples, one or more features/recesses can have a width of about 10 nanometers (nm) to about 300 nm, or 300 nm to 1000 nm, a depth or height of about 30 nm to about 1000 nm, and/or an aspect ratio of about 3 to 100.

In some embodiments, "film" refers to a layer extending in a direction perpendicular to a thickness direction. In some embodiments, "layer" refers to a material having a certain thickness formed on a surface and can be a synonym of a film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers.

As used herein, the term "carbon layer" or "carbon material" can refer to a layer whose chemical formula can be represented as including carbon. Layers comprising carbon material can include other elements, such as one or more of nitrogen and hydrogen.

As used herein, the term "silicon carbide layer" or "silicon carbide material," or like terms, can refer to a layer whose chemical formula can be represented as including silicon and carbon. Layers comprising silicon carbide material can include other elements, such as one or more of oxygen, nitrogen, and hydrogen.

As used herein, the term "structure" can refer to a partially or completely fabricated device structure. By way of examples, a structure can be a substrate or include a substrate with one or more layers and/or features formed thereon.

In this disclosure, "continuously" can refer to without breaking a vacuum, without interruption as a timeline, without any material intervening step, without changing treatment conditions, immediately thereafter, as a next step, or without an intervening discrete physical or chemical structure between two structures other than the two structures in some embodiments and depending on the context.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc., in some embodiments. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

Figure 1:
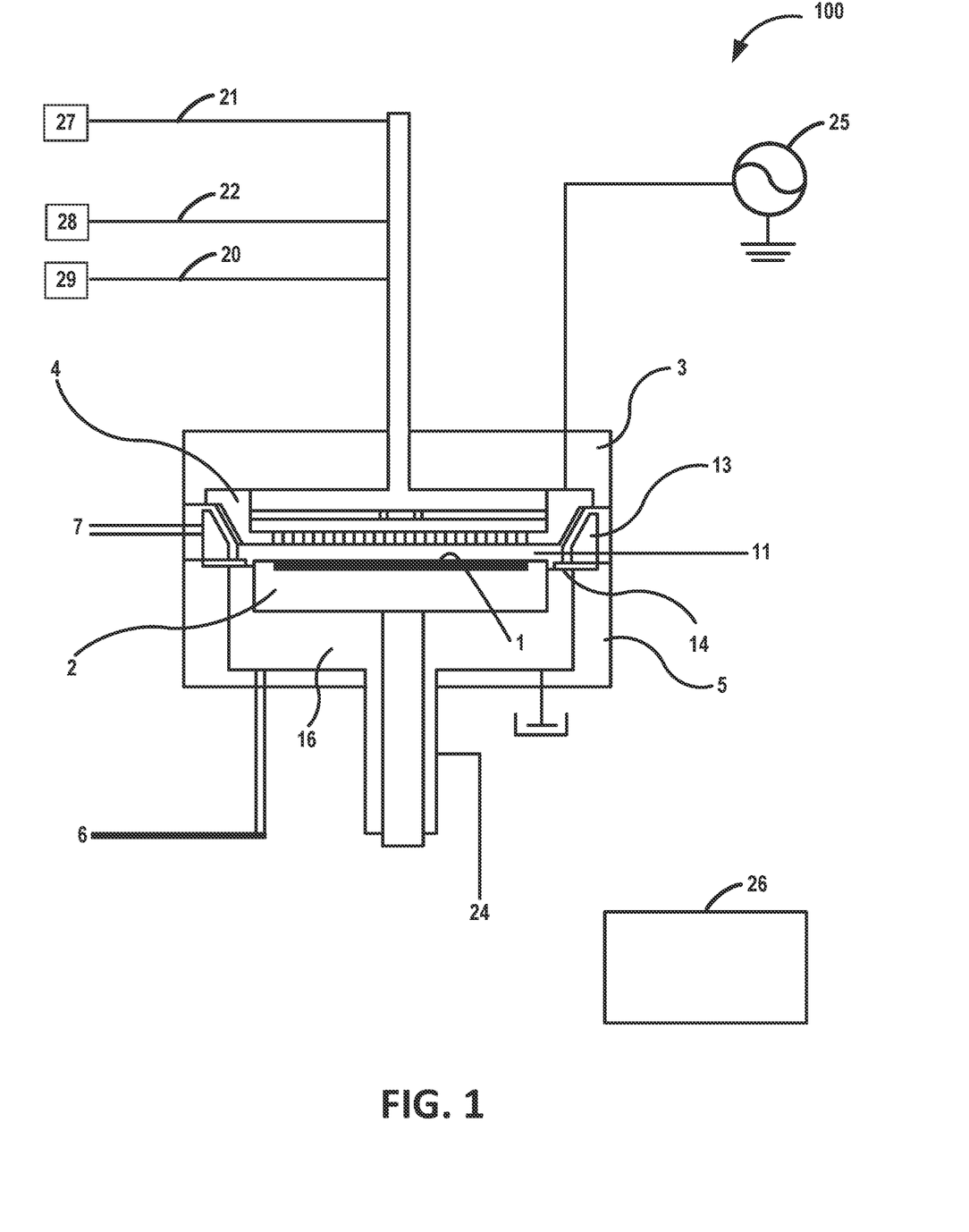
FIG. 1 illustrates a system in accordance with exemplary embodiments of the disclosure.

Turning now to the figures, FIG. 1 illustrates a reactor system 100 in accordance with exemplary embodiments of the disclosure. Reactor system 100 can be used to perform one or more methods, steps or sub steps as described herein and/or to form one or more structures or portions thereof as described herein.

Reactor system 100 includes a pair of electrically conductive flat-plate electrodes 4, 2 in parallel and facing each other in the interior 11 (reaction zone) of a reaction chamber 3 (electrode 2 may be a susceptor). A plasma can be excited within reaction chamber 3 by applying, for example, HRF power (e.g., 13.56 MHz or 27 MHz) from power source 25 to one electrode (e.g., electrode 4) and electrically grounding the other electrode (e.g., electrode 2). A temperature regulator can be provided in a lower stage 2 (the lower electrode or susceptor), and a temperature of a substrate 1 placed thereon can be kept at a desired temperature. Electrode 4 can serve as a gas distribution device, such as a showerhead. Reactant gas, precursor gas, purge gas, carrier gas, inert gas, and/or the like can be introduced from a source 27, 28, and/or 29 into reaction chamber 3 using one or more of a gas line 20, a gas line 21, and a gas line 22, respectively, and through the showerhead 4. Although illustrated with three gas lines, reactor system 100 can include any suitable number of gas lines.

In reaction chamber 3, a circular duct 13 with an exhaust line 7 is provided, through which gas in the interior 11 of the reaction chamber 3 can be exhausted. Additionally, a transfer chamber 5, disposed below the reaction chamber 3, is provided with a seal gas line 24 to introduce seal gas into the interior 11 of the reaction chamber 3 via the interior 16 (transfer zone) of the transfer chamber 5, wherein a separation plate 14 for separating the reaction zone and the transfer zone is provided (a gate valve through which a wafer is transferred into or from the transfer chamber 5 is omitted from this figure). The transfer chamber is also provided with an exhaust line 6. In some embodiments, the deposition and treatment steps are performed in the same reaction space, so that two or more (e.g., all) of the steps can continuously be conducted without exposing the substrate to air or other oxygen-containing atmosphere.

In some embodiments, continuous flow of an inert or carrier gas to reaction chamber 3 can be accomplished using a flow-pass system (FPS). In various embodiments, an inert or carrier gas may be flowed to reaction chamber 3 separately from other gases, or with another gas (e.g., a precursor gas). For example, in an FPS, a carrier gas line may be provided with a detour line having a precursor reservoir (bottle). The main line and the detour line of the FPS may be switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the inert or carrier gas can continuously flow into the reaction chamber, and can carry the precursor gas in pulses by switching between the main line and the detour line, without substantially fluctuating pressure of the reaction chamber.

A skilled artisan will appreciate that the apparatus includes one or more controller(s) 26 programmed or otherwise configured to cause one or more method steps as described herein to be conducted. The controller(s) are communicated with the various power sources, heating systems, pumps, robotics and gas flow controllers, or valves of the reactor, as will be appreciated by the skilled artisan. By way of example, controller 26 can be configured to perform the flowing of gases, opening or closing of gas lines, depositing, exposing, and/or post-deposition treatment steps of a method described herein.

Figure 2:
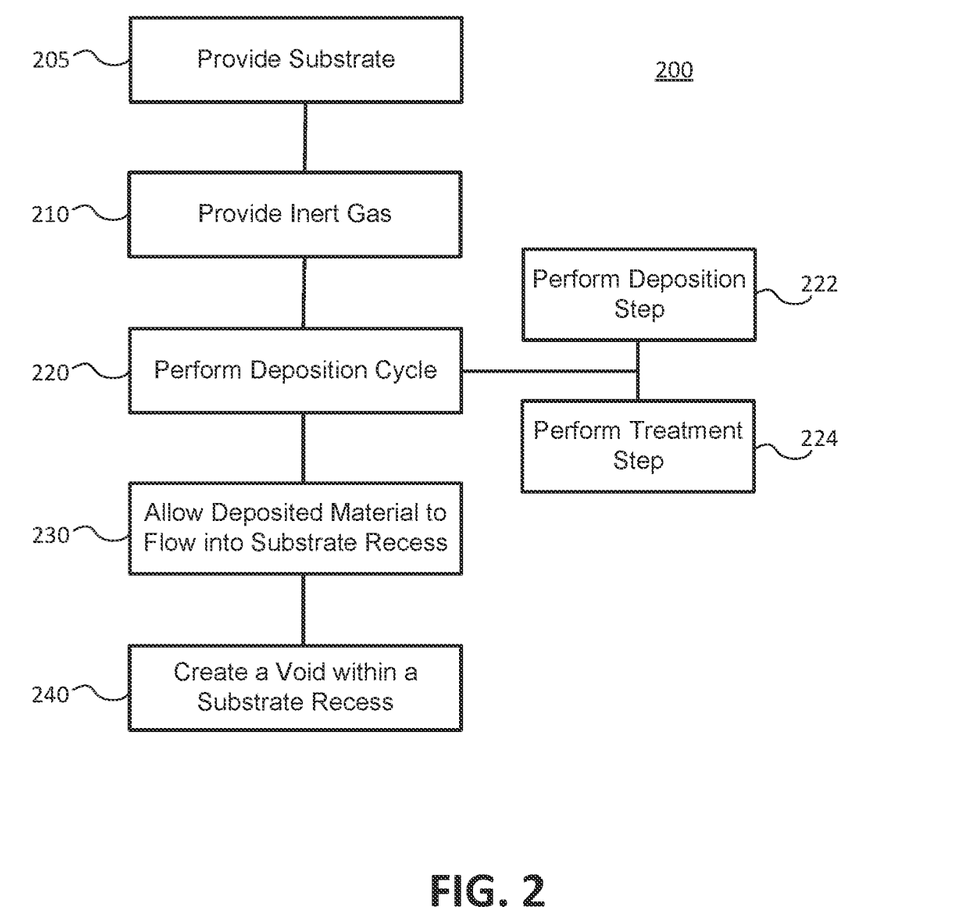
FIG. 2 illustrates a method in accordance with exemplary embodiments of the disclosure.

With additional reference to FIG. 2, FIG. 2 illustrates a method 200 in accordance with examples of the disclosure. Method 200 can be used to deposit a material on a substrate to, e.g., to fill one or more recesses on a surface of a substrate, for example, using reactor system 100.

Method 200 includes the steps of providing a substrate within a reaction chamber (step 205), providing a gas to the reaction chamber (step 210), performing a deposition cycle (step 220), allowing the deposited material to flow into a substrate recess (step 230), and creating a void within the substrate recess (step 240).

During step 205 of providing a substrate within a reaction chamber, the substrate is provided into a reaction chamber of a gas-phase reactor. In accordance with examples of the disclosure, the reaction chamber can form part of a deposition reactor, such as an atomic layer deposition (ALD) (e.g., PEALD) reactor or chemical vapor deposition (CVD) (e.g., PECVD) reactor. Various steps of methods described herein can be performed (e.g., continuously) within a single reaction chamber or can be performed in multiple reaction chambers, such as reaction chambers of a cluster tool.

During step 205, the substrate can be brought to a desired temperature and/or the reaction chamber can be brought to a desired pressure, such as a temperature and/or pressure suitable for subsequent steps. By way of examples, a temperature (e.g., of a substrate or a substrate support) within a reaction chamber can be about 50° C. to about 800° C. A pressure within the reaction chamber can be from about 100 Pa to about 1,300 Pa. In accordance with particular examples of the disclosure, the substrate includes one or more features, such as recesses.

During processing of the substrate within a reaction chamber, in various embodiments, a gas may be provided to the reaction chamber (step 210). The gas may be any suitable gas, such as an inert gas (e.g., argon gas, helium gas, and/or nitrogen gas ($N_2$)) or hydrogen gas ($H_2$). The gas may be continually provided to reaction chamber (e.g., during multiple deposition cycles, processing steps, or during overall processing of a substrate). A flowrate of the gas to the reaction chamber during this step can be from about 500 sccm to about 8,000 sccm. The gas can be used to facilitate ignition and/or maintenance of a plasma within the reaction chamber, to purge reactants and/or byproducts from the reaction chamber, and/or be used as a carrier gas to assist with delivery of the precursor to the reaction chamber.

In various embodiments, a deposition cycle 220 is performed on the substrate (step 220). In various embodiments, deposited material may fill the one or more recesses in the surface of the substrate during deposition cycle 220.

In various embodiments, performing a deposition cycle (step 220) may comprise performing a deposition step (step 222) and/or performing a treatment step (step 224). In various embodiments, deposition step 222 may comprise providing a precursor to the reaction chamber, and forming a deposited material on substrate 1 from the precursor. The precursor may be provided from a precursor source in fluid communication with reaction chamber 3 (e.g., from source 27, 28, and/or 29 in FIG. 1). The precursor may comprise any suitable compounds, such as a silicon carbide precursor and/or a carbon precursor. The precursor can include one or more of carbon and silicon. In accordance with various examples of the disclosure, the precursor may include a cyclic structure and/or a carbonyl functional group. Exemplary cyclic structures include the cyclic structure selected from the group consisting of benzene; indene; cyclopentadiene; cyclohexane; pyrrole; furan; thiophene; phosphole; pyrazole; imidazole; oxazole; isoxazole; thiazole; indole; benzofuran; benzothiophene; isoindole; isobenzofuran; benzophosphole; benzimidazole; benzoxazole; benzothiazole; benzoisoxazole; indazole; benzoisothiazole; benzotriazole; purine; pyridine; phosphinine; pyrimidine; pyrazine; pyridazine; triazine; 1,2,4,5-tetrazine; 1,2,3,4-tetrazine; 1,2,3,5-tetrazine; hexazine; quinoline; isoquinoline; quinoxaline; quinazoline; cinnoline; pteridine; phthalazine; acridine; 4aH-xanthene; 4aH-thioxanthene; 4aH-phenoxazine; 4a,10a-dihydro-10H-phenothiazine; and carbazole. Exemplary carbonyl groups can be selected from one or more of the group consisting of aldehyde, ketone, carboxylic acid, ester, amide, enone, acyl chloride, and acid anhydride. In accordance with further examples of the disclosure, the precursor includes one or more carbonyl groups and one or more of a methyl group, ethyl group, propyl group, butyl group, amine group, and hydroxy group. The precursor can include, for example, 1-6 or 1-4 functional groups attached to a cyclic structure, wherein one or more of the functional groups includes a carbonyl functional group. The carbonyl group can include one or more functional groups—e.g., selected from the group consisting of C1-C6 (e.g., C1-C3) alkane, alkene, or alcohol functional groups.

In various embodiments, a silicon carbide precursor may comprise compounds represented by the formula $Si_aC_bH_cN_d$, where a is a natural number, b is a natural number, c is a natural number, and d is 0 or a natural number. For example, a can range from 1-5, b can range from 1-20, c can range from 1-40, and/or d can range from 0-5. The silicon carbide precursor can include a chain or cyclic molecule having one or more carbon atoms, one or more silicon atoms, and one or more hydrogen atoms, such as molecules represented by the formula above. By way of particular examples, the precursor can be or include one or more cyclic (e.g., aromatic) structures and/or compounds having at least one double bond. In various embodiments, a silicon carbide precursor may comprise trisilylamine (TSA), hexamethyldisilane, and/or dimethyldivinylsilane (DMDVS).

In accordance with some examples of the disclosure, a chemical formula of the silicon carbide precursor can be represented by the formula:

where $R_1$-$R_6$ are independently selected from (C1-C10) alkyl, alkene, or aryl groups and H. By way of particular example, each of $R_1$-$R_6$ can include a methyl group as illustrated by the following chemical formula.

In accordance with other examples of the disclosure, a chemical formula of the silicon carbide precursor can be represented by the formula:

where $R_1$-$R_4$ are independently selected from (e.g., C1-C10) alkyl, alkene, or aryl groups and H. For example, the chemical formula can be represented by In various embodiments, a carbon precursor may comprise an alkane (e.g., methane, ethane, propane, butane, pentane, hexane, etc.), an alkene, an alkyne, a compound having the chemical formula $C_9H_{12}$, and/or any other suitable compound.

Figure 3:
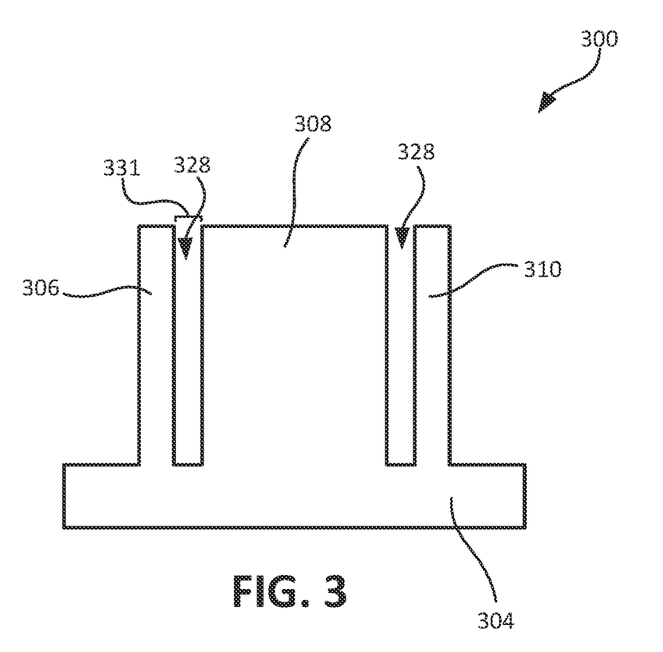
FIG. 3 illustrates a structure in accordance with exemplary embodiments of the disclosure.

The deposited material formed from the precursor on substrate 1 may be disposed within a recess with the surface of substrate 1. For example, with reference to FIG. 3, structure 300 may comprise a substrate 304 having protrusions 306-310 formed thereon. The deposited material from deposition step 222 may be deposited on substrate 304, protrusions 306-310, and in recesses 328.

In various embodiments, treatment step 224 may comprise applying a plasma power electrodes (e.g., as illustrated in FIG. 1), and forming an activated species therefrom to interact with and treat the deposited material. The activated species can be formed using, for example, a direct plasma. A power used to form the plasma can range from about 10 W to about 5000 W. An RF frequency of the power can range from about 400 kHz to about 100 MHz. A duration of a plasma treatment step can range from about 5 seconds to about 3,000 seconds. A temperature within the reaction chamber during a plasma treatment step can be about 50° C. to about 800° C. or about 30° C. to about 700° C. A pressure within the reaction chamber during a plasma treatment can be between about 100 Pa and about 1,300 Pa.

In various embodiments, the deposited material may be allowed to flow into a recess in the substrate (step 230). The deposited material may flow into a substrate recess in response to a deposition step 222 and/or a treatment step 224 (e.g., the deposited material may flow into the substrate recess after deposition step 222, before treatment step 224, and/or during either). The flowability of the deposited material may be influenced or adjusted based on a ratio ("Repeat Ratio") of the number of times deposition step 222 is repeated (a "deposition repeat number") to the number of times treatment step 224 is repeated (a "treatment repeat number") within a deposition cycle 220. In various embodiments, the greater the Repeat Ratio, the more flowable, and less viscous, the deposited material, and vice versa. That is, to achieve a more flowable deposited material on a substrate and/or within a recess in the substrate, the deposition repeat number may increase relative to the treatment repeat number, or the treatment repeat number may decrease relative to the deposition repeat number (i.e., the number of times deposition step 222 is performed increases relative to, or followed by, one treatment step 224 performed, or the number of times treatment step 224 is performed decreases relative to, or following, one deposition step 222). Conversely, to achieve a less flowable deposited material on a substrate and/or within a recess in the substrate, the deposition repeat number may decrease relative to the treatment repeat number, or the treatment repeat number may increase relative to the deposition repeat number (i.e., the number of times deposition step 222 is performed decreases relative to, or followed by, one treatment step 224 performed, or the number of times treatment step 224 is performed increases relative to, or following, one deposition step 222). Accordingly, within a deposition cycle 220, deposition step 222 and/or treatment step 224 may be repeated any suitable number of times, in any suitable order, to achieve a desired flowability of the deposited material on the substrate.

In various embodiments, a void may be formed in a substrate recess (step 240). The void may be air-filled (i.e., having no deposited material therein), and may be at least partially defined by the deposited material. For example, a top portion of a void in a substrate recess may be defined by the deposited material. The void size may be dependent or based on the Repeat Ratio. Thus, in response to a relatively higher Repeat Ratio forming a relatively more flowable (or less viscous) deposited material, the void formed may be relatively smaller. In response to a relatively lower Repeat Ratio forming a relatively less flowable (or more viscous) deposited material, the void formed may be relatively larger.

With additional reference to FIGS. 4A-4D, structures 400A-400D may comprise a substrate 404 with a deposited material 440 disposed thereon and/or therein. Structures 400A-400D may comprise protrusions 406-410, with recesses 428 disposed therebetween. As discussed in relation to method 200, deposited material 440 may be disposed onto substrate 404 during deposition step 222, and allowed to flow into recesses 428 (step 230).

Figure 4A:
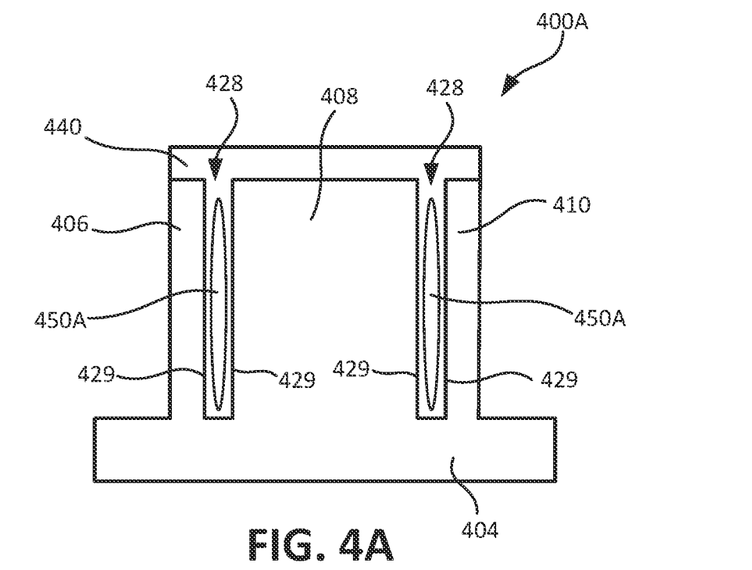
FIGS. 4A-4D illustrate structures with deposited material disposed thereon in accordance with exemplary embodiments of the disclosure.
Figure 4B:
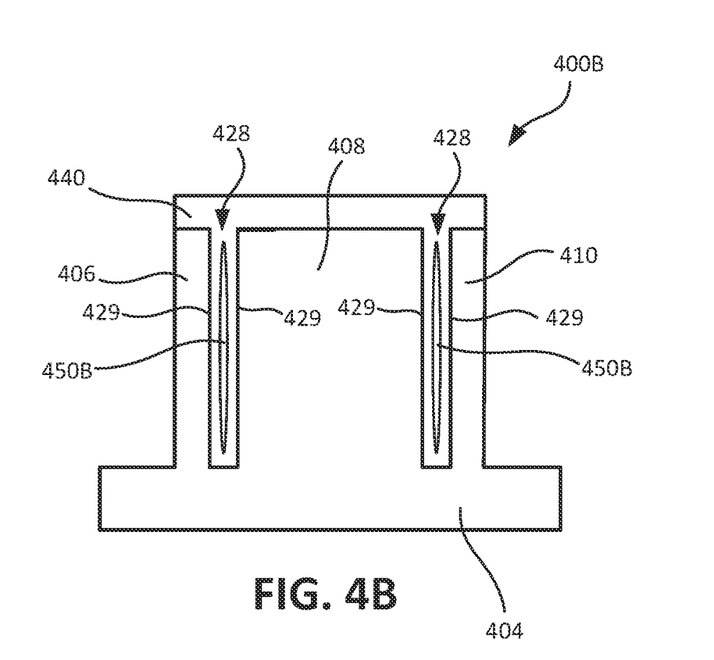
Figure 4C:
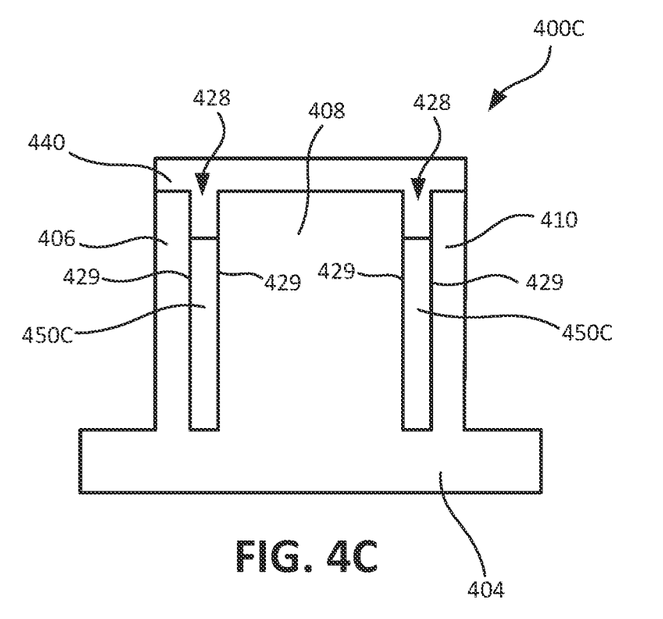
Figure 4D:
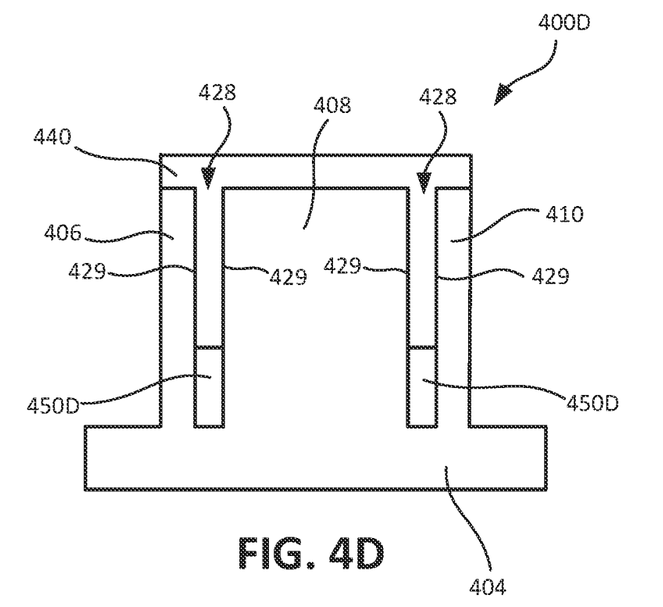

Deposited material 440 may flow into recesses 428 through a recess opening or top portion. As depicted, for example, voids 450C and 450D may be at least partially defined by deposited material 440, recess walls 429, and/or substrate 404. In various embodiments, as depicted in FIGS. 4A and 4B, deposited material 440 may flow into recesses 428 along recess walls 429, which may result in deposited material 440 being disposed at a bottom of recesses 428. Therefore, voids 450A and 450B may be at least partially surrounded and defined by the deposited material 440.

Depending on the desired size of voids to be formed in recesses 428, the Repeat Ratio may be adjusted accordingly to achieve such a desired void size. For example, the Repeat Ratio may be relatively higher to create void 450B (a relatively smaller void formed from relatively more flowable, and less viscous, deposited material 440) than the Repeat Ratio to create void 450A (a relatively larger void formed from relatively less flowable, and more viscous, deposited material 440). As another example, the Repeat Ratio may be relatively higher to create void 450D (a relatively smaller void formed from relatively more flowable, and less viscous, deposited material 440) than the Repeat Ratio to create void 450C (a relatively larger void formed from relatively less flowable, and more viscous, deposited material 440). That is, in order to form relatively smaller voids within recesses 428, deposition step 222 may be repeated multiple times before a treatment step 224 occurs, or treatment steps 224 may be performed relatively fewer times after a deposition step 222 occurs. In order to form relatively larger voids in within recesses 428, a treatment step 224 may more frequency be performed after deposition steps 222 (e.g., multiple treatment steps 224 after every deposition step 222).

Along similar lines, in various embodiments, the Repeat Ratio is based or dependent on a width of a substrate recess (e.g., width 331 of recess 328, shown in FIG. 3) and/or on an aspect ratio of a substrate recess (width:height of the respective recess). To achieve a desired void size (e.g., void width and/or depth in a recess), in response to the recess width being relatively larger, the Repeat Ratio may be relatively lower than a Repeat Ratio for a recess having a relatively smaller width (e.g., because with a smaller width, less viscosity and more flowability of the deposited material may be required to sufficiently penetrate a recess to achieve the desired void size). For example, in response to a recess width being less than 300 nanometers (nm), the Repeat Ratio may be 1:1 (i.e., one deposition step and one treatment step, e.g., one treatment step following every deposition step). As a further example, in response to a recess width being between 300 nm and 1000 nm, the Repeat Ratio may be between 1:2 and 1:6 (i.e., between a ratio of one deposition step to two treatment steps and one deposition step to six treatment steps, e.g., between two and six treatment steps following every one deposition step). With regard to aspect ratios, in response to an aspect ratio of between 1:30 and 1:9, a Repeat Ratio may be between 1:2 and 1:6.

Without being bound by theory, treatment by an activated species may cause the deposited material 440 to become more solid, thus decreasing flowability and increasing viscosity. Thus, to create smaller voids within substrate recesses 428, more deposition steps 222 may be performed before a treatment step, or fewer treatment steps may be performed after a deposition step, to allow deposited material 440 to flow further into recesses 428, thus occupying more space therein and creating a relatively smaller void.

Figure 5:
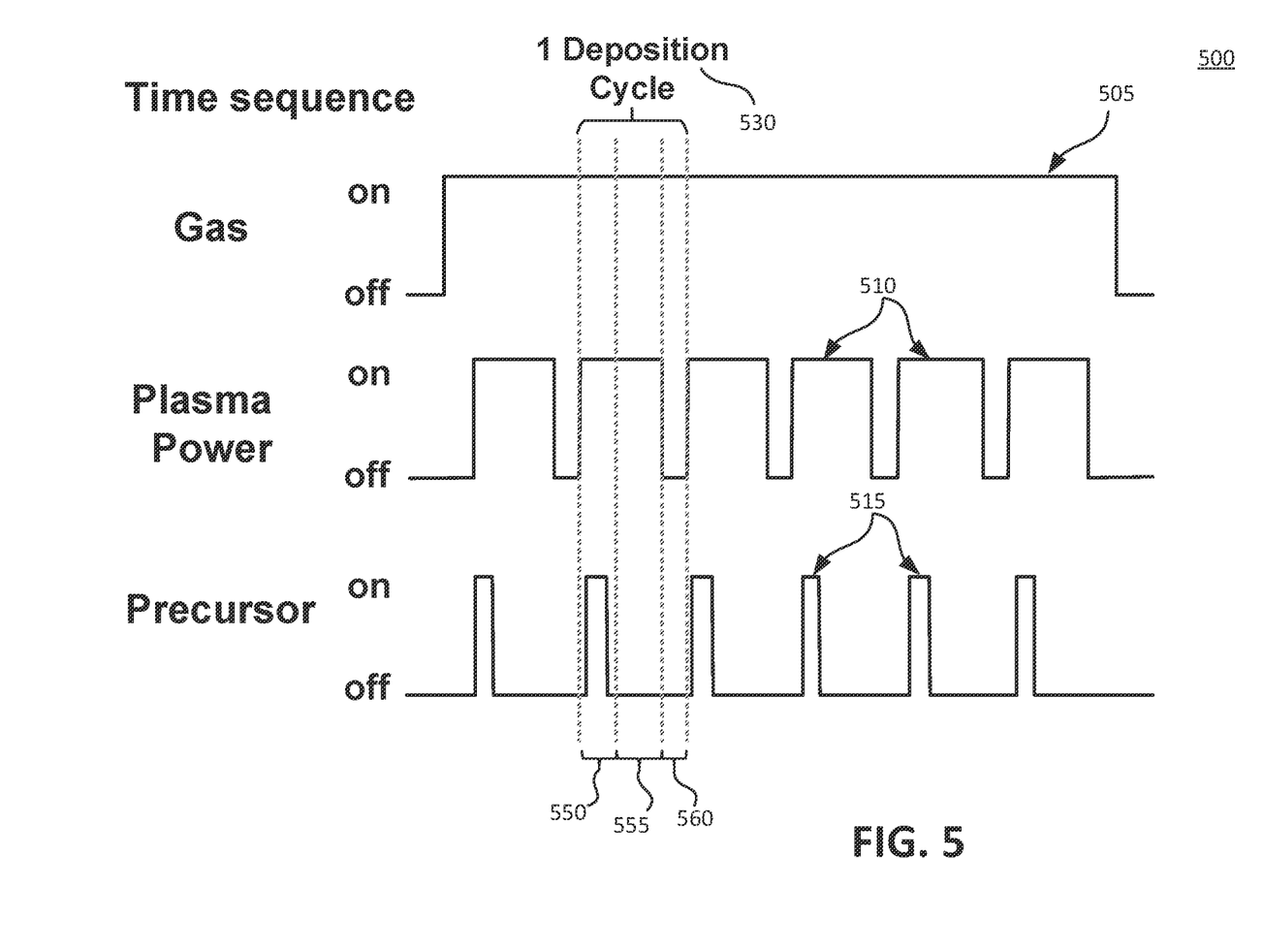
FIG. 5 illustrates a timing sequence in accordance with exemplary embodiments of the disclosure.
Figure 6:
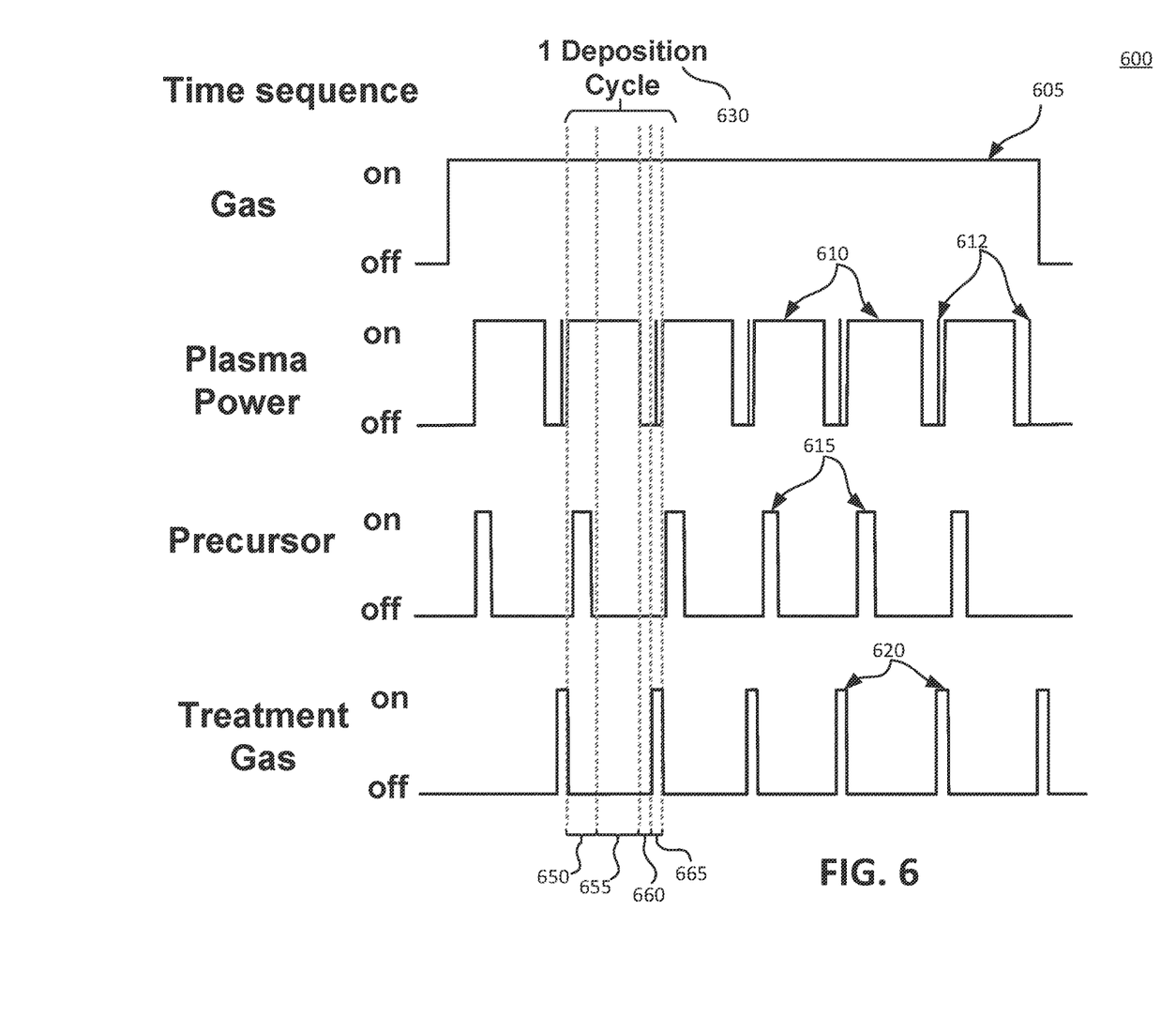
FIG. 6 illustrates another timing sequence in accordance with exemplary embodiments of the disclosure.

FIGS. 5 and 6 illustrate examples of pulse timing sequences for methods in accordance with exemplary embodiments of the disclosure. For example, timing sequences illustrated in FIGS. 5 and 6 can be used in connection with method 200.

FIGS. 5 and 6 schematically illustrate a gas, a radio frequency (RF) for producing an activate species (e.g., a plasma) (i.e., plasma power pulses), and a precursor, and additionally in FIG. 6, a treatment gas, where gases and/or plasma power are provided to a reactor system or reaction space for a pulse period. The width of the pulses may not necessarily be indicative of an amount of time associated with each pulse; the illustrated pulses can illustrate relative start times and/or end times of the various pulses. Similarly, a height may not necessarily be indicative of a specific amplitude or value, but can show relatively high and low values. Process conditions for each pulse period can be as described above in connection with corresponding steps of method 200. The examples below are merely illustrative and are not meant to limit the scope of the disclosure or claims.

FIG. 5 illustrates a timing sequence 500 in accordance with examples of the disclosure. Timing sequence 500 includes a plurality of deposition cycles comprising deposition steps, treatment steps, and/or purge steps. In accordance with examples of these embodiments, the number of deposition cycles may range from about 10 to about 1000.

In the example illustrated in FIG. 5, a gas (e.g., an inert or carrier gas) may be provided to the reaction space as indicated by block 505. In various embodiments, the gas provided in block 505 may be provided continuously to the reaction chamber (e.g., over multiple deposition cycles, steps, and/or for the entire processing period for a substrate). The gas may comprise any suitable gas, such has helium or hydrogen gas, or any other gases described herein.

Power to form an activated species (e.g., plasma) may be provided for a pulse period 510. Pulse period 510 can range from about 5.0 to about 10 seconds and can be the same or different and/or can vary from deposition cycle to deposition cycle. A power (e.g., applied to electrodes) during pulse period 510 can range from about 100 W to about 800 W, or as otherwise noted herein. A frequency of the power can range from about 2.0 MHz to about 27.12 MHz, or as otherwise noted herein. In various embodiments, plasma may be formed by or as a result of the gas provided to the reaction chamber during block 505.

After pulse period 510 is initiated, a precursor may be provided to the reaction chamber for a pulse period 515. The precursor may be any suitable precursor, such as those discussed herein. Pulse period 515 can range from about 0.1 to about 0.5 seconds and can be the same or different and/or can vary from deposition cycle to deposition cycle. As illustrated, pulse periods 510 and 515 can overlap. For example, pulse period 515 can start after pulse period 510, and/or pulse period 515 can cease prior to pulse period 510 ceasing. That is, with additional reference to method 200 in FIG. 2, during a deposition cycle 220, providing a precursor of deposition step 222 may occur during forming an activated species (e.g., plasma) of treatment step 224. Further, providing a precursor of deposition step 222 may begin after forming an activated species (e.g., plasma) of treatment step 224 begins. Yet further, providing a precursor of deposition step 222 may cease before forming an activated species (e.g., plasma) of treatment step 224 ceases.

As shown in timing sequence 500, a deposition cycle 530 may comprise deposition step 550 (e.g., deposition step 222 of method 200), which includes pulse period 515, during which the precursor is provided to the reaction chamber. A material may be deposited on a substrate in response to deposition step 550, and the deposited material may flow into a substrate recess, as discussed herein. Deposition cycle 530 may further comprise a treatment step 555 (e.g., deposition step 224 of method 200) following deposition step 550. Thus, the Repeat Ratio of deposition cycle 530 may be 1:1 (one treatment step 555 for one deposition step 550). In response to treatment step 555 ceasing, the plasma power pulse 510 may cease. In various embodiments, a plasma formed from pulse 510 during deposition step 550 (providing the precursor) may be formed from applying a first plasma power. During treatment step 555, the plasma may be formed by applying a second plasma power which is greater than the first plasma power. Therefore, during treatment of the deposited material on the substrate, the plasma power may be higher than before or during application of the precursor.

In response to the plasma power ceasing, a purge step 560 may be performed (method 200, discussed herein, may also comprise a purge step to remove precursor, plasma, or other compounds from the reaction chamber in preparation for another deposition cycle). The purge can be further assisted by way of a vacuum pump. The purge period can range from, for example, about 5.0 seconds to about 30.0 seconds. Each purge period can be the same or vary in time.

FIG. 6 illustrates a timing sequence 600 in accordance with examples of the disclosure. Timing sequence 600 includes a plurality of deposition cycles comprising deposition steps, treatment steps, and/or purge steps. In accordance with examples of these embodiments, the number of deposition cycles may range from 10 to about 1000.

In the example illustrated in FIG. 6, a gas (e.g., an inert or carrier gas) may be provided to the reaction space as indicated by block 605. In various embodiments, the gas provided in block 605 may be provided continuously to the reaction chamber (e.g., continuously over multiple deposition cycles, steps, treatment steps, and/or for the entire processing period for a substrate). The gas may comprise any suitable gas, such has helium or hydrogen gas, or any other gases described herein.

Power to form an activated species (e.g., plasma) may be provided for a first pulse period 610 and/or a second pulse period 612. Pulse period 610 can range from about 2 to about 10 seconds and can be the same or different and/or can vary from deposition cycle to deposition cycle. Pulse period 612 can range from about 0.1 to about 1 second and can be the same or different and/or can vary from deposition cycle to deposition cycle. A power (e.g., applied to electrodes) during pulse periods 610 and/or 612 can range from about 100 W to about 800 W, or as otherwise noted herein. A frequency of the power can range from about 2.0 MHz to about 27.12 MHz, or as otherwise noted herein. The plasma may be formed by or as a result of the gas provided to the reaction chamber during block 605, or pulse period 620 for a treatment gas, discussed herein.

After pulse period 610 is initiated, a precursor may be provided to the reaction chamber for a pulse period 615. The precursor may be any suitable precursor, such as those discussed herein. Pulse period 615 can range from about 0.1 to about 10 seconds and can be the same or different and/or can vary from deposition cycle to deposition cycle. As illustrated, pulse periods 610 and 615 can overlap. For example, pulse period 615 can start after pulse period 610, and/or pulse period 615 can cease prior to pulse period 610 ceasing. That is, with additional reference to method 200 in FIG. 2, during a deposition cycle 220, providing a precursor of deposition step 222 may occur during forming an activated species (e.g., plasma) of treatment step 224. Further, providing a precursor of deposition step 222 may begin after forming an activated species (e.g., plasma) of treatment step 224 begins. Yet further, providing a precursor of deposition step 222 may cease before forming an activated species (e.g., plasma) of treatment step 224 ceases.

As shown in timing sequence 600, a deposition cycle 630 may comprise deposition step 650 (e.g., deposition step 222 of method 200), which includes pulse period 615, during which the precursor is provided to the reaction chamber. A material may be deposited on a substrate in response to deposition step 650, and the deposited material may flow into a substrate recess, as discussed herein. Deposition cycle 630 may further comprise a treatment step 655 (e.g., deposition step 224 of method 200) following deposition step 650. In response to treatment step 655 ceasing, the plasma power pulse 610 may cease. In various embodiments, a plasma formed from pulse 610 deposition step 650 (providing the precursor) may be formed from applying a first plasma power. During treatment step 655, the plasma may be formed by applying a second plasma power which is greater than the first plasma power. Therefore, during treatment of the deposited material on the substrate, the plasma power is higher than before or during application of the precursor.

In response to the plasma power ceasing, a purge step 660 may be performed. The purge can be further assisted by way of a vacuum pump. The purge period can range from, for example, about 5.0 seconds to about 30.0 seconds. Each purge period can be the same or vary in time.

After purge step 660, deposition cycle 630 may further comprise a second treatment step 665. For second treatment step 665, power to form a second activated species (e.g., a second plasma) may be provided for second pulse period 612. A treatment gas (such as oxygen gas or argon gas) may be provided to the reaction chamber for a pulse period 620 during second treatment step 665. The second plasma may be formed from the treatment gas, or the treatment gas may contribute to, or facilitate the formation of, the second plasma. The formed second plasma from second pulse period 612 may treat the deposited material from deposition step 650, and/or the deposited material may be treated by the oxygen gas or argon gas. Thus, the Repeat Ratio of deposition cycle 630 may be 1:2 (two treatment steps 655 and 665 for one deposition step 650).

As discussed herein, the disclosed systems and methods allow the tailored formation of a void within a substrate recess by the flowing of deposited material within the recess, based on the number of deposition steps relative to the number of treatment steps. For example, time sequence 500 and deposition cycle 530 may be implemented to form a smaller void (or for use with a relatively smaller recess width) than time sequence 600 and deposition cycle 630, because deposition cycle 630 comprises a smaller Repeat Ratio (fewer deposition steps versus treatment steps than deposition cycle 530), and thus may produce a more viscous, less flowable, deposited material. Therefore, the systems and methods discussed herein facilitate receiving the electrical benefits of voids within substrate recesses at least partially filled with deposited material (e.g., mitigating or preventing parasitic capacitance between device or structure components). Additionally, with the ability to form a void of a desired size within a substrate recess, the risk of mechanical failure at least partially caused by a void may be mitigated. Thus, this disclosure provides a method to form a void within a substrate recess having a void size achieving desired electrical benefits and mechanical strength.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems methods and apparatus are provided herein. In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

What is claimed is:

1. A method of filling a recess on a surface of a substrate, comprising:
    providing the substrate within a reaction chamber;
    performing a deposition cycle, comprising:
        providing an inert gas to the reaction chamber;
        performing a deposition step, wherein a deposition step comprises:
            providing a precursor to the reaction chamber; and
            forming a deposited material from the precursor;
        performing a treatment step, wherein the treatment step comprises forming a plasma in the reaction chamber by applying a plasma power and treating the deposited material; and
    allowing the deposited material to flow into the recess; and
    creating a void within the recess in response to the allowing the deposited material to flow, wherein a top portion of the void is defined by the deposited material, wherein a void size of the void is based on a ratio of a deposition repeat number of times that the deposition step is repeated to a treatment repeat number of times that the treatment cycle is repeated.

2. The method of claim 1, wherein, in response to the ratio of the deposition repeat number to the treatment repeat number increasing, the void size decreases, and wherein the void size increases in response to the ratio of the deposition repeat number to the treatment repeat number decreasing.

3. The method of claim 1, wherein the deposited material flows into the recess at a recess top portion and along a recess wall of the recess.

4. The method of claim 1, wherein the deposition cycle further comprises purging the reaction chamber after the treating the deposited material.

5. The method of claim 4, wherein the deposition cycle further comprises performing a second treatment step comprising forming the plasma by applying the plasma power and treating the deposited material after the purging the reaction chamber.

6. The method of claim 5, wherein the treating the deposited material comprises treating the deposited material with the plasma, and wherein the performing the second treatment step on the deposited material comprises treating the deposited material with at least one of oxygen gas or argon gas.

7. The method of claim 1, wherein the deposition cycle further comprises performing a second treatment step on the deposited material after the treating the deposited material.

8. The method of claim 7, wherein the forming the plasma occurs during the treating the deposited material and the performing a second treatment step on the deposited material.

9. The method of claim 1, wherein the inert gas comprises at least one of argon, helium, or nitrogen.

10. The method of claim 1, wherein the precursor comprises a silicon carbide precursor.

11. The method of claim 1, wherein the silicon carbide precursor comprises a trisilylamine.

12. The method of claim 1, wherein, during a deposition cycle, the providing the precursor to the reaction chamber occurs during the step of forming the plasma within the reaction chamber.

13. The method of claim 12, wherein, during a deposition cycle, the providing the precursor to the reaction chamber begins after the step of forming the plasma begins.

14. The method of claim 12, wherein, during a deposition cycle, the providing the precursor ceases before the forming the plasma ceases.

15. The method of claim 1, wherein the inert gas is continuously flowed to the reaction chamber during the deposition step and the treatment step.

16. The method of claim 1, wherein the treating the deposited material comprises treating the deposited material with at least one of the plasma, oxygen gas, or argon gas.

17. The method of claim 16, wherein the treating the deposited material comprises treating the deposited material with the plasma.

18. The method of claim 17, wherein, during the deposition cycle, the providing the precursor to the reaction chamber occurs during the step of forming the plasma in the reaction chamber, wherein the plasma formed during the providing the precursor is formed by applying a first plasma power, and wherein during the treating the deposited material, the plasma is formed by applying a second plasma power, wherein the second plasma power is greater than the first plasma power.

19. The method of claim 1, wherein the ratio of the deposition repeat number to the treatment repeat number is based on a width of the recess, wherein in response to the width being relatively larger, the ratio of the deposition repeat number to the treatment repeat number is relatively lower, and wherein in response to the width being relatively smaller, the ratio of the deposition repeat number to the treatment repeat number is relatively higher.

20. The method of claim 19, wherein the ratio of the deposition repeat number to the treatment repeat number is about 1:1 in response to the width of the recess being below 300 nanometers (nm), and wherein the ratio of the deposition repeat number to the treatment repeat number is between 1:2 and 1:6 in response to the width of the recess being between 300 nm and 1000 nm.

* * * * *